United States Patent
Ratkovich et al.

(10) Patent No.: US 9,059,104 B2
(45) Date of Patent: Jun. 16, 2015

(54) PROCESS FOR SELECTIVELY REMOVING NITRIDE FROM SUBSTRATES

(75) Inventors: Anthony S. Ratkovich, Edina, MN (US); Jeffery W. Butterbaugh, Eden Prarie, MN (US); David Scott Becker, Excelsior, MN (US)

(73) Assignee: TEL FSI, INC., Chaska, MN (US)

( * ) Notice: Subject to any disclaimer, the term of this patent is extended or adjusted under 35 U.S.C. 154(b) by 288 days.

(21) Appl. No.: 13/312,148

(22) Filed: Dec. 6, 2011

(65) Prior Publication Data

US 2012/0145672 A1 Jun. 14, 2012

Related U.S. Application Data

(60) Provisional application No. 61/421,808, filed on Dec. 10, 2010.

(51) Int. Cl.
*B44C 1/22* (2006.01)
*H01L 21/311* (2006.01)
*H01L 21/67* (2006.01)

(52) U.S. Cl.
CPC .... *H01L 21/31111* (2013.01); *H01L 21/67051* (2013.01); *H01L 21/6708* (2013.01)

(58) Field of Classification Search
CPC .............. H01L 21/6708; H01L 21/67051; H01L 21/32134; C09K 13/04
See application file for complete search history.

(56) References Cited

U.S. PATENT DOCUMENTS

| | | | |
|---|---|---|---|
| 6,087,273 A * | 7/2000 | Torek et al. ............... | 438/756 |
| 6,123,865 A | 9/2000 | Lin et al. | |
| 6,406,551 B1 | 6/2002 | Nelson et al. | |
| 6,488,272 B1 | 12/2002 | Nguyen | |
| 6,835,667 B2 | 12/2004 | Christenson et al. | |
| 7,592,264 B2 | 9/2009 | Christenson et al. | |
| 7,819,984 B2 | 10/2010 | DeKraker et al. | |
| 2004/0261817 A1 | 12/2004 | Araki et al. | |
| 2005/0205115 A1 | 9/2005 | Okuyama et al. | |
| 2007/0087456 A1 | 4/2007 | Hashizume | |
| 2007/0245954 A1 | 10/2007 | Collins et al. | |
| 2008/0008834 A1 | 1/2008 | Collins et al. | |
| 2008/0283090 A1 * | 11/2008 | DeKraker et al. ............ | 134/3 |
| 2009/0280235 A1 | 11/2009 | Lauerhaas et al. | |
| 2013/0078809 A1 | 3/2013 | Yu et al. | |

OTHER PUBLICATIONS

A.L.P. Rotondaro et al., "Use of $H_2SO_4$ for ETCH Rate and Selectivity Control of Boiling $H_3PO_4$," Electrochemical Society Proceedings vol. 99-36, p. 385-390 (1999).

Gelder et al., "The Etching of Silicon Nitride in Phosphoric Acid with Silicon Dioxide as a Mask" J. Electrochem. Soc.: Solid State Science, vol. 114, No. 8, pp. 869-872, Aug. 1967.

Yu et al., "Novel Wet Etching of Silicon Nitride in a Single Wafter Spin Processor" Solid State Phenomena, vol. 195, pp. 46-49, 2013.

* cited by examiner

*Primary Examiner* — Lan Vinh
*Assistant Examiner* — Jiong-Ping Lu
(74) *Attorney, Agent, or Firm* — Kagan Binder, PLLC

(57) ABSTRACT

A method of selectively removing silicon nitride from a substrate comprises providing a substrate having silicon nitride on a surface thereof; and dispensing phosphoric acid and sulfuric acid onto the surface of the substrate as a mixed acid liquid stream at a temperature greater than about 150° C. In this method, water is added to a liquid solution of the mixed acid liquid stream as or after the liquid solution of the mixed acid liquid stream passes through a nozzle.

26 Claims, 2 Drawing Sheets

PROCESS FOR SELECTIVELY REMOVING NITRIDE FROM SUBSTRATES

PRIORITY CLAIM

This application claims the benefit of U.S. Provisional Application Ser. No. 61/421,808, filed Dec. 10, 2010, entitled PROCESS FOR SELECTIVELY REMOVING NITRIDE FROM SUBSTRATES, the disclosure of which is incorporated herein by reference in its entirety for all purposes.

FIELD OF THE INVENTION

The present invention relates to methods for removing nitride from substrates. More specifically, the present invention relates to removal of nitride, and preferably silicon nitride, from substrates using sulfuric acid, phosphoric acid and water.

BACKGROUND OF THE INVENTION

Advances in electronic technology cause integrated circuits to be formed on substrates such as silicon wafers with ever increasing packing density of active components. The formation of circuits is carried out by sequential application, processing, and selective removal of various materials from the substrate. Various compositions have been developed for removal of specific classes of materials from substrates in semiconductor wafer technologies. For example, a composition commonly denoted SC-1, which contains a mixture of $NH_4OH$ (29 wt %)/$H_2O_2$ (30 wt %)/water at a volume ratio of about 1:1:5 (or at somewhat higher dilution ratios), is typically used to remove particles and to reoxidize hydrophobic silicon surfaces. Similarly, a composition commonly denoted SC-2, which contains a mixture of HCl (37 wt %)/$H_2O_2$ (30 wt %)/water at a volume ratio of about 1:1:5 (or at somewhat higher dilution ratios), is typically used to remove metals. An additional composition, commonly called a Piranha composition, comprises $H_2SO_4$ (98 wt %)/$H_2O_2$ (30 wt %) at a volume ratio of about 2:1 to 20:1, and is typically used to remove organic contamination or some metal layers.

Removing materials, and preferably photoresist, from a substrate is described in U.S. Pat. No. 7,592,264. In this patent, a liquid sulfuric acid composition comprising sulfuric acid and/or its desiccating species and precursors and having a water/sulfuric acid molar ratio of no greater than 5:1 is dispensed onto an material coated substrate in an amount effective to substantially uniformly coat the material coated substrate. The substrate is preferably heated to a temperature of at least about 90° C., either before, during or after dispensing of the liquid sulfuric acid composition. After the substrate is at a temperature of at least about 90° C., the liquid sulfuric acid composition is exposed to water vapor in an amount effective to increase the temperature of the liquid sulfuric acid composition above the temperature of the liquid sulfuric acid composition prior to exposure to the water vapor. The substrate is then preferably rinsed to remove the material.

A method of treating a substrate is described in U.S. Pat. No. 7,819,984, whereby a substrate having material on a surface thereof is placed in a treatment chamber and a stream of a liquid treatment composition is directed to impinge the substrate surface with a stream of water vapor directed to impinge the substrate surface and/or to impinge the liquid treatment composition.

Silicon nitride is used as a mask material in the formation of various devices. In these processing techniques, the silicon nitride mask is selectively removed by etching as compared to other materials in place on the substrate, and particularly silicon oxide. Submersion of the substrate comprising silicon nitride in a bath of boiling $H_3PO_4$ has been used as an etching process for such applications, due to a selectivity of about 35:1 etching of silicon nitride as compared to silicon dioxide. In order to provide control of the selectivity and etch rate, such baths are pre-conditioned by first seasoning the bath with sacrificial silicon nitride coated wafers in incorporate silica into the bath at a desired level. A method of avoiding such seasoning of the bath is described in A. L. P. Rotondaro et al., "USE OF $H_2SO_4$ FOR ETCH RATE AND SELECTIVITY CONTROL OF BOILING $H_3PO_4$," Electrochemical Society Proceedings Volume 99-36, page 385-390 (1999), wherein the etch rate and selectivity of a phosphoric acid bath is improved by addition of sulfuric acid to the bath.

It would be desirable to identify alternative techniques and compositions for treatment of substrates, particularly to remove nitride materials, especially silicon nitride, from substrates such as semiconductor wafers.

SUMMARY OF THE INVENTION

The present invention provides a process for selective removal of silicon nitride films from the surface of a substrate, preferably an in-process semiconductor wafer for integrated circuit fabrication. The process provides excellent selectivity of etch of silicon nitride, and further provides rapid etch, thereby improving productivity of the tool for processing the substrate.

In the present method, silicon nitride is selectively removed from a substrate by a) providing a substrate having silicon nitride on a surface thereof; and b) dispensing phosphoric acid and sulfuric acid onto the surface of the substrate as a mixed acid liquid stream at a temperature greater than about 150° C., wherein water is added to the liquid solution of the mixed acid liquid stream as or after the liquid solution of the mixed acid liquid stream passes through a nozzle. The mixed acid liquid stream having water added may impinge the substrate in the form of a continuous stream or as liquid aerosol droplets. For purposes of the present invention, "dispensing" means that the phosphoric acid and sulfuric acid are delivered onto the surface as a flow of material, such as by spraying or pouring the liquid onto the surface. Dispensing or dispense, for purposes of the present invention, is a dynamic delivery of treatment material from a source to the surface with only transient residence, and is distinguished from immersion of the substrate, for example, in a treatment bath. In an embodiment of the present invention, the mixed acid liquid is dispensed onto the surface by spraying, i.e. applying the material as a discharge under pressure. In another embodiment, the mixed acid liquid is dispensed onto the surface by flowing, i.e. applying the material as a non-pressurized continuous or discontinuous stream.

It has been surprisingly found that the etch rate of silicon nitride is significantly improved by addition of water in the present dispense treatment process. Further, it has been found that silicon nitride etch rates significantly increase with increasing temperature, and further when the water is added in the form of water vapor. In preferred methods of the present invention, the mixed acid liquid stream is dispensed onto the surface of the substrate at a temperature at or greater than about 180° C., more preferably at or greater than about 200° C., and preferably at a temperature of from about 190° C.-240° C. In preferred methods of the present invention, the water is added in the form of water vapor.

In an embodiment of the present invention, silicon nitride is removed at a rate relative to silicon oxide of 100:1 or greater.

In another embodiment, the absolute removal rate is greater than 50 angstroms/minute. This selectivity and high removal rate is particularly advantageous, because it facilitates use of silicon nitride etch techniques using a single wafer processing tool. Additionally, the present invention provides efficient nitride etch capability without the complications of traditional 165° C., 85% phosphoric acid wet bench processes that require "seasoning" of the chemical, i.e. the creation and maintenance of dissolved silica concentration by processing dummy wafers. The use of seasoned baths of the prior art is disadvantageous, because the bath life is limited, and high levels of particle defects may be introduced on the substrate surface due to excess silicon in the bath. Thus, the present invention provides a method to achieve high selectivity and removal rate goals with single-pass, point-of-use blended, fresh chemicals, without the need for seasoning.

The present dispense technique additionally may be operated at a higher temperature than the prior art bath operation. Point-of-use mixing as described herein enables a fast, single wafer, single pass process.

BRIEF DESCRIPTION OF THE DRAWINGS

The accompanying drawings, which are incorporated in and constitute a part of this application, illustrate several aspects of the invention and together with a description of the embodiments serve to explain the principles of the invention. A brief description of the drawings is as follows.

DETAILED DESCRIPTION OF PRESENTLY PREFERRED EMBODIMENTS

Figure 1:
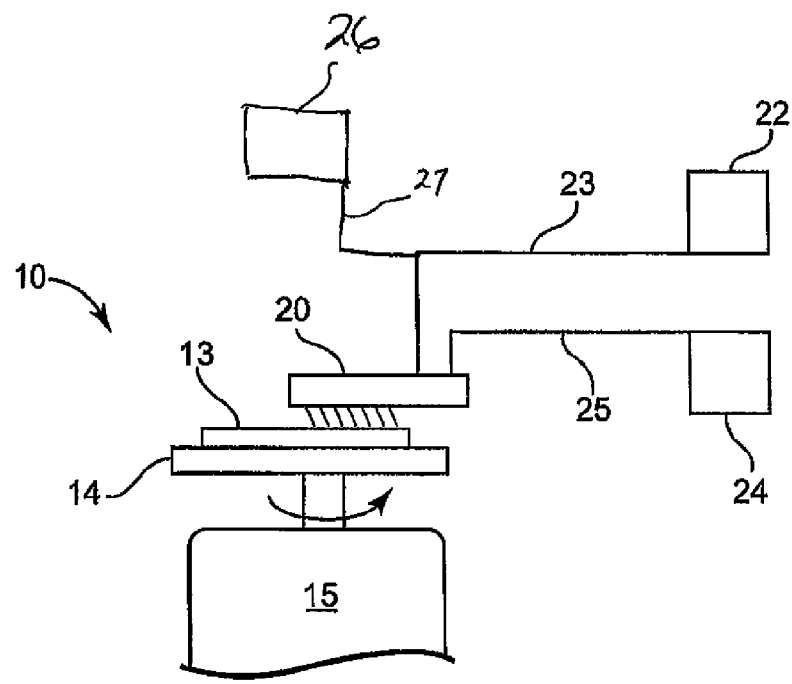
FIG. 1 is a schematic diagram of an apparatus that can carry out an embodiment of the process of the present invention.

The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

As noted above, a substrate is provided having silicon nitride on a surface thereof. The substrate is preferably a semiconductor substrate, and most preferably is an in-process silicon wafer. The substrate is at an intermediate stage of being provided with one or more electronic devices by a mask and etch operation, wherein silicon nitride is to be preferentially removed relative to other material being retained on the substrate, such as silicon oxides.

The selective removal of silicon nitride is carried out by dispensing phosphoric acid and sulfuric acid onto the surface of the substrate as a mixed acid liquid stream at a temperature greater than about 150° C., wherein water is added to a liquid solution of the mixed acid liquid stream as or after the liquid solution of the mixed acid liquid stream passes through a nozzle. The water addition has been found to enhance the silicon nitride etch rate. The present process also exhibits excellent selectivity of silicon nitride etch as compared to silicide, polysilicon and silicon oxides.

The nitride etch enhancement effect described above is observed at all temperatures, and therefore advantageously permits selective etching at relatively low processing temperatures (i.e. from about 150° C. to 180° C.). The ability to provide selective etching at such processing temperatures is advantageous for certain substrates, device parameters, or tool set-ups in which the use of higher temperature conditions is undesirable. However, nitride etch enhancement effect is more pronounced at temperatures at or greater than about 180° C., more preferably at or greater than about 200° C., and preferably at a temperature of from about 190° C.-240° C. The observed etch rate and selectivity of etch for nitride at these higher temperatures is especially surprising.

The phosphoric acid and sulfuric acid can be mixed in various ways to provide a mixed acid liquid stream. In one embodiment, the phosphoric acid and sulfuric acid can be mixed in a vessel for storage prior to dispensing from the nozzle as a mixed acid liquid stream. Alternatively, the phosphoric acid and sulfuric acid can be mixed in-line at a location upstream from the nozzle to form a mixed acid liquid stream. In another embodiment, the phosphoric acid and sulfuric acid can be mixed in a nozzle assembly prior to being ejected from the nozzle as a mixed acid liquid stream. In another embodiment, the phosphoric acid solution and the sulfuric acid solution can dispensed as separate liquid solution in the form of streams from separate orifices of the nozzle assembly. These separate streams then impinge and form a mixed acid liquid stream externally of the nozzle and prior to contact with the substrate surface. The liquids can be dispensed in the form of a liquid stream or an aerosol.

The liquids of the mixed acid liquid stream can be heated to the desired application temperature at any desired location in the dispensing process. For example, the liquids can be individually preheated and then mixed, or can be mixed and then heated to the desired temperature. The liquids can be heated in bulk, or in the process line in an on-demand basis.

In an embodiment of the present invention, the mixed acid liquid stream is prepared by mixing a phosphoric acid solution that is at least about 80% by weight phosphoric acid with a sulfuric acid solution that is at least about 90% by weight sulfuric acid in a volume ratio of phosphoric acid to sulfuric acid that is from 3:1 to 1:6. In another embodiment, the phosphoric acid solution is 85% (by weight) phosphoric acid and the sulfuric acid solution is 98% (by weight) sulfuric acid.

In an embodiment of the present invention, the volume ratio of phosphoric acid to sulfuric acid is from 1:2 to 1:4.

In a preferred embodiment, the liquid sulfuric acid solution has a water/sulfuric acid molar ratio of no greater than about 5:1. Thus, the liquid sulfuric acid solution is limited in water content. In one embodiment, the liquid sulfuric acid solution may comprise a solvent that does not substantially interfere with the coordination of subsequently added water (and preferably water vapor) with sulfuric acid, as discussed in more detail herein. Preferred such solvents are inert with respect to the substrate to be treated (e.g. the wafer), such as fluorine based liquids. An example of such inert solvents include the Fluorinert™ solvents commercially available from 3M, St. Paul, Minn. It should be noted that the above mentioned molar ratio recites the water/sulfuric acid molar ratio, and not the solvent/sulfuric acid ratio. This underscores that the solvent that does not substantially interfere with the coordination of subsequently added water with sulfuric acid does not factor into this ratio of the present inventive embodiment. More preferably, the liquid sulfuric acid composition is highly concentrated. Preferably, the liquid sulfuric acid solution is dispensed at a sulfuric acid concentration of at least about 80 vol %, more preferably at least about 90 vol %, and most preferably at least about 94 vol %.

Water is added to a liquid solution of the mixed acid liquid stream as or after the liquid solution of the mixed acid liquid stream passes through a nozzle. It has been found that addition of water to the system immediately prior to application of the mixed acid liquid stream to the substrate provides a number of benefits. First, the mixed acid liquid stream may be readily heated to a higher temperature than more dilute solutions having water added earlier. This is because the boiling point of concentrated acid is higher than the boiling point of a diluted acid. Additionally, when the liquid water is added to concentrated sulfuric acid in particular, the resulting mixture is beneficially heated in the mixing process by the heat of mixing of these solutions.

There is a particular advantage when the water of the water addition is in the form of water vapor. Water in the vapor stage has more energy than water in the liquid state, which corresponds roughly to the heat of vaporization stored in the water vapor. While not being bound by theory, water vapor may additionally be in a more reactive state relative to silicon nitride than water in the liquid state or at a lower temperature. While not being bound by theory, it is further believed that the concentrated liquid sulfuric acid composition of the mixed acid liquid stream has a desiccating effect, thereby causing water from the water vapor to be condensed into the mixed acid liquid stream and releasing the energy corresponding roughly to the heat of vaporization stored in the water vapor.

For purposes of the present invention, water vapor is defined as water in the gaseous form, and distinguished from small droplets of water commonly called "mist." Because mist is water that is condensed in the form of small droplets, there is essentially no net warming effect when mist settles on a surface that would correspond to a heat of vaporization. For purposes of the present invention, steam is vaporized water at or above the boiling point of water, which depends on the pressure, e.g. 100° C. if the pressure is 1 atmosphere. When steam is provided at a temperature greater than the boiling point of water, is it called superheated steam. Water vapor optionally may be provided from compositions comprising ingredients in addition to water, such as dissolved gasses such as nitrogen. It is contemplated that water vapor may be supplied in any manner, either essentially pure, or in compositions, either above, or below or at 100° C., and having pressures or partial pressures of water vapor either above, below or at 1 atm.

It has been found that mixing in particular a concentrated sulfuric acid solution with a water-containing solution as described above is an exothermic interaction, liberating heat energy. It therefore is advantageous to mix these solutions immediately prior to application of the mixed acid liquid stream to the substrate in order to utilize this extra energy and promote a higher etch rate. Also, this exothermic effect may allow the liquid acid solutions to be heated to a lower initial temperature, such as 150° C., before mixing with water or, in particular, steam. In addition, treating the substrate with this chemical mixture in the presence of steam or water vapor, or simultaneously dispensing steam or water vapor while pouring or dispensing the chemical mixture may provide additional temperature increase as it is expected that the dissolution of steam into the mixed acid liquid stream having a high concentration of sulfuric acid will produce an additional exotherm, or release of energy.

FIG. 1 shows a modified spray processing system 10 for carrying out the present invention. In system 10, wafer 13, as a particular microelectronic device for example, is supported on a rotatable chuck 14 that is driven by a spin motor 15. This portion of system 10 corresponds to a conventional spray processor device. Spray processors have generally been known, and provide an ability to remove liquids with centrifugal force by spinning or rotating the wafer(s) on a turntable or carousel, either about their own axis or about a common axis. Exemplary spray processor machines suitable for adaptation in accordance with the present invention are described in U.S. Pat. Nos. 6,406,551 and 6,488,272, which are fully incorporated herein by reference in their entireties. Spray processor type machines are available from FSI International, Inc. of Chaska, Minn., e.g., under one or more of the trade designations ORION®, MERCURY® or ZETA®. Another example of a tool system suitable for adaptation in accordance with the present invention is described in U.S. Patent Publication No. 2007/0245954, entitled BARRIER STRUCTURE AND NOZZLE DEVICE FOR USE IN TOOLS USED TO PROCESS MICROELECTRONIC WORKPIECES WITH ONE OR MORE TREATMENT FLUIDS; or as described in U.S. Patent Application Publication No. 2005/0205115, entitled RESIST STRIPPING METHOD AND RESIST STRIPPING APPARATUS or U.S. Patent Application Publication No. 2009/0280235, entitled TOOLS AND METHODS FOR PROCESSING MICROELECTRONIC WORKPIECES USING PROCESS CHAMBER DESIGNS THAT EASILY TRANSITION BETWEEN OPEN AND CLOSED MODES OF OPERATION.

Spray bar 20 comprises a plurality of nozzles to direct liquid onto wafer 13 in the form of a continuous stream or as liquid aerosol droplets. The sulfuric acid solution is provided from liquid supply reservoir 22 through line 23, and the stream of water vapor is similarly provided from supply reservoir 24 though line 25. Phosphoric acid is provided from phosphoric acid supply reservoir 26 through line 27 to sulfuric acid supply line 23. This configuration permits addition of phosphoric acid to the sulfuric acid solution with the benefit that the phosphoric acid is not stored and heated in the presence of sulfuric acid, and additionally that the amount of phosphoric acid used in the treatment method may be independently controlled from the amount of sulfuric acid as dictated by specific process requirements. Thus, a variable phosphoric acid concentration can be applied during a treatment process as desired. Alternatively, the phosphoric acid can be supplied to the stream of water vapor at line 25. Spray bar 20 is preferably provided with a plurality of nozzles to generate aerosol droplets of treatment composition that results from impinging the mixed acid liquid stream with the stream of water vapor. In a preferred embodiment, nozzles are provided at a spacing of about 3.5 mm in spray bar 20 at locations corresponding to either the radius of the wafer or the full diameter of the wafer when spray bar 20 is in position over wafer 13. Nozzles may optionally be provided at different spacing closer to the axis of rotation as compared to the spacing of the nozzles at the outer edge of the wafer. A preferred spray bar configuration is described in U.S. Patent Application Publication No. 2008/0008834, entitled "BARRIER STRUCTURE AND NOZZLE DEVICE FOR USE IN TOOLS USED TO PROCESS MICROELECTRONIC WORKPIECES WITH ONE OR MORE TREATMENT FLUIDS."

Figure 2:
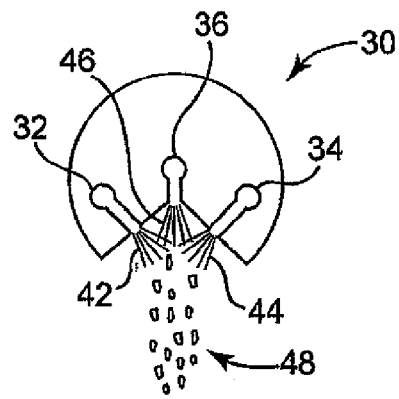
FIG. 2 is a cross sectional view of a spray bar for carrying out an embodiment of the process of the present invention.

A cross-sectional view of a spray bar 30 is shown in FIG. 2, illustrating a preferred nozzle configuration of the present invention. For purposes of the present invention, an integrally arranged set of orifices in a body that is directed to provide streams that impinge one another is considered a single nozzle. In the configuration as shown, acid liquid stream orifices 32 and 34 are directed inward to provide impinging streams 42 and 44. Water vapor dispense orifice 36 is located as shown in this embodiment between liquid acid solution orifices 32 and 34, so water vapor stream 46 impinges with liquid acid streams 42 and 44 externally of the nozzle body. As a result of this impingement, atomization occurs, thereby forming liquid aerosol droplets 48. In addition, the droplets are given enhanced directional momentum toward the surface of the substrate because of the relatively high pressure of the water vapor stream as it exits from water vapor dispense orifice 36. This centrally located orifice in the nozzle assembly thus provides an advantageous directional aspect to assist in removal of material from the surface of the substrate. Alternatively, the positioning of the orifices may be reversed, i.e., the acid liquid stream may be dispensed from orifice 36 and water vapor may be dispensed from orifices 32 and 34.

Optionally, an additional ingredient, such as a gas, may be dispensed from one or more orifices in the nozzle assembly.

The location, direction of the streams and relative force of the streams are selected to preferably provide a directional flow of the resulting liquid aerosol droplets, so that the droplets are directed to the surface of a substrate to effect the desired treatment.

In one embodiment, the liquid aerosol droplets are caused to contact the surface at an angle that is perpendicular to the surface of the wafer. In another embodiment, the liquid aerosol droplets are caused to contact the surface of the wafer at an angle of from about 10 to less than 90 degrees from the surface of the wafer. In another embodiment, the liquid aerosol droplets are caused to contact the surface of the wafer at an angle of from about 30 to about 60 degrees from the surface of the wafer. In an embodiment, the wafer is spinning at a rate of about 10 to about 1000 rpm during contact of the aerosol droplets with the surface of the wafer. In another embodiment, the wafer is spinning at a rate of about 50 to about 500 rpm. The direction of the contact of the droplets with the wafer may in one embodiment be aligned with concentric circles about the axis of spin of the wafer, or in another embodiment may be partially or completely oriented away from the axis of rotation of the wafer. System 10 preferably employs suitable control equipment (not shown) to monitor and/or control one or more of fluid flow, fluid pressure, fluid temperature, combinations of these, and the like to obtain the desired process parameters in carrying out the particular process objectives to be achieved.

Figure 3:
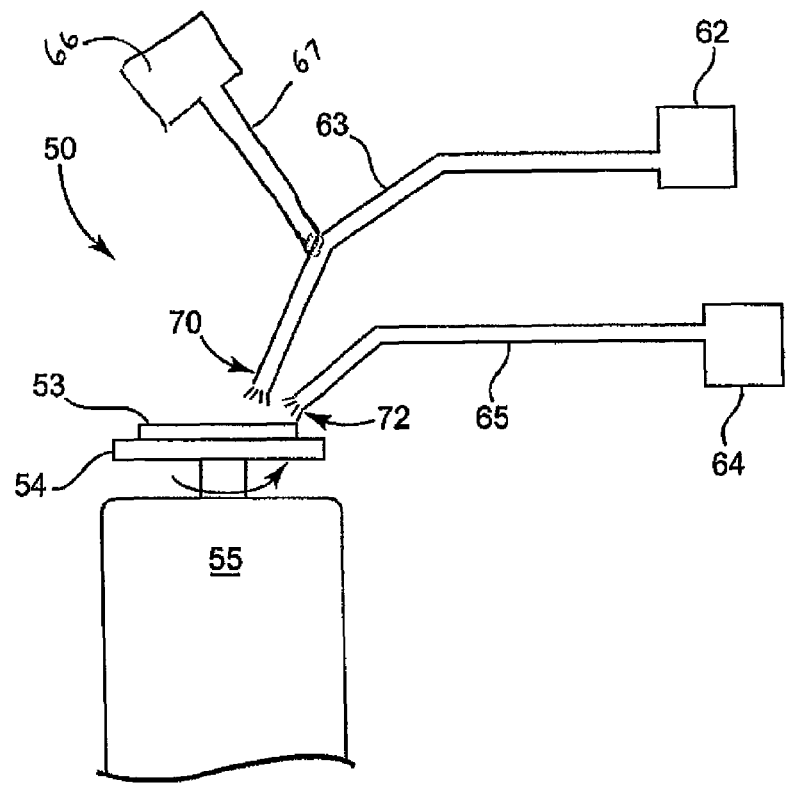
FIG. 3 is a schematic diagram of an apparatus that can carry out an embodiment of the process of the present invention.

FIG. 3 shows an example of a modified spray processing system 50 for carrying out an aspect of the present invention, where liquid acid solution is dispensed onto a substrate surface. In system 50, wafer 53, as a particular microelectronic device for example, is supported on a rotatable chuck 54 that is driven by a spin motor 55. As above in system 10, this portion of system 50 corresponds to a conventional spray processor device. Liquid sulfuric acid solution is provided from liquid supply reservoir 62 through line 63 to dispense orifice 70, which is configured to dispense a liquid acid stream onto the substrate surface. Phosphoric acid is provided from phosphoric acid supply reservoir 66 through line 67 to sulfuric acid supply line 63. This configuration permits addition of phosphoric acid solution to the sulfuric acid solution with the benefit that the phosphoric acid is not stored and heated in the presence of sulfuric acid, and additionally that the amount of phosphoric acid used in the treatment method may be independently controlled from the amount of sulfuric acid as dictated by specific process requirements. Thus, a variable phosphoric acid concentration can be applied during a treatment process as desired. A stream of water vapor is similarly provided from supply reservoir 64 though line 65 to dispense orifice 72. Alternatively, the phosphoric acid can be supplied to the stream of water vapor at line 65. Dispense orifices 70 and 72 may are configured so that the stream of liquid sulfuric acid composition and the stream of water vapor intersect prior to impinging the surface of the substrate. In an embodiment of the present invention, the dispense orifices 70 and 72 are moved together during the treatment to scan across the surface of the substrate. In an embodiment of the present invention, lines 65 and 63 can be linked to form a two orifice nozzle array to assist in positioning control for scanning across the surface of the substrate.

In embodiments of the present invention, a gas inert to the particular species present in the treatment process, such as nitrogen gas, may be directed at the reverse side of the wafer to modulate the wafer temperature and to promote etch uniformity. In a preferred embodiment, a stream of gas is directed to the reverse side of the wafer corresponding to the primary impact area of the mixed acid liquid stream to provide a localized offsetting cooling effect.

In one embodiment of the present invention, the substrate is pretreated with a pretreatment liquid, such as an acid pretreatment, that acts to modify the surface characteristics of the substrate as desired. For example, the substrate may be pretreated with a dilute HF composition to remove any surface oxide that may have formed on the nitride.

In an embodiment of the present invention, a small amount of HF may be included in the mixed acid liquid stream or in the added water. Advantageously, the present process further comprising hot, dilute HF in a small amount, preferably less than 2%, more preferably less than one percent based on total weight of liquid applied to the substrate, may improve the nitride etching rate and selectivity. Appropriate HF solutions and species are described in U.S. Pat. No. 6,835,667, which is incorporated herein by reference.

Wafers are preferably heated to a temperature of at least about 90° C., either before, during or after dispensing of the treatment composition. More preferably, wafers are heated to a temperature of from about 90° C. to about 150° C. In another embodiment, the wafers are heated to a temperature of from about 95° C. to about 120° C. This heating can be carried out, for example, by heating the chamber using radiant heat, introduction of hot water or other liquid solution to the wafer with substantial removal of the heated liquid prior to application of the concentrated sulfuric acid composition, introduction of heated gases to the chamber, and the like.

In one embodiment of the present invention, the wafers can be preheated by submerging one or more wafers into a heated bath of liquid, quickly draining the contents of the bath (e.g. a "quickdump" procedure) and conducting the remaining treatment steps as described below. The bath liquid can be, for example, DI water, DI water containing sulfuric acid, sulfuric acid/hydrogen peroxide mixture, an inert fluid (such as a fluorocarbon), sulfuric acid/ozone mixture, and the like. This embodiment can provide substantial benefit in enhancing throughput of the treatment process by more efficiently heating the wafers. An example of a particularly suitable process system that can be used to employ this embodiment is the Magellan® system commercially available from FSI International, Chaska, Minn.

The method of the present invention may be used to process multiple wafer-like objects simultaneously, as occurs with batches of wafers when being processed in a spray processing tool such as the MERCURY® or ZETA® spray processors commercially available from FSI International, Inc., Chaska, Minn., or the Magellan® system, also commercially available from FSI International, Chaska, Minn.

The present invention is preferably used in single wafer processing applications where the wafers are either moving or fixed. The present invention permits selective removal of silicon nitride at a sufficiently rapid rate to allow economical use of single wafer processing systems. The single wafer system affords superior control of the processing conditions of each wafer, and avoids damage to multiple wafers in the event of catastrophic process failure, because only one wafer is treated at a time.

The use of each of the described embodiments of the present invention as an intermediate process in an in-line wafer treatment process is specifically contemplated as an embodiment of the present invention.

EXAMPLES

Representative embodiments of the present invention will now be described with reference to the following examples that illustrate the principles and practice of the present invention.

The improvement of the silicon nitride etch rate by addition of steam was demonstrated in the following Examples.

Example 1

Control

85% (by weight) phosphoric acid is mixed with 98% (by weight) sulfuric acid in a volume ratio of 1:1, and sprayed onto substrate samples having an LPCVD silicon nitride film at a total flow of 1.4 L/min. The total water content of the mixture as applied after a 1 minute dispense for the control process is ~9.3% wt. This water content includes the water present in the acid solutions. The temperature observed on the wafer during dispense was 165° C. The nitride removal rate for this process was 6.36 Å/minute, and the silicon oxide removal rate was 0.22 Å/minute.

Example 2

85% (by weight) phosphoric acid is mixed with 98% (by weight) sulfuric acid in a volume ratio of 1:1, and sprayed onto substrate samples having an LPCVD silicon nitride film at a total flow of 1.4 L/min with addition of steam at the dispense nozzle. The total water content of the mixture as applied after a 1 minute dispense for the control process is ~13.2% wt. The temperature observed on the wafer during dispense was 170° C. The nitride removal rate for this process including addition of steam was 30.94 Å/minute, which is a 5× improvement in nitride etch rate by steam addition. The silicon oxide removal rate was 0.33 Å/minute.

Example 3

Control

85% (by weight) phosphoric acid is mixed with 98% (by weight) sulfuric acid in a volume ratio of 1:1, and dispensed onto substrate samples having an LPCVD silicon nitride film at a total flow of 1.6 L/min. The total water content of the mixture as applied after a 3 minute dispense for the control process is ~9.3% wt. This water content includes the water present in the acid solutions. The temperature observed on the wafer during dispense was 190° C. The nitride removal rate for this process was 65.5 Å/minute (196.7 Å total nitride), and the silicon oxide removal rate was 1.12 Å/minute.

Example 4

85% (by weight) phosphoric acid is mixed with 98% (by weight) sulfuric acid in a volume ratio of 1:1, and dispensed onto substrate samples having an LPCVD silicon nitride film at a total flow of 1.6 L/min with addition of steam at the dispense nozzle. The total water content of the mixture as applied after a 3 minute dispense for the control process is ~13.2% wt. The temperature observed on the wafer during dispense was 195° C. The nitride removal rate for this process including addition of steam was 98.7 Å/minute (296.0 Å total nitride), which is a 50.7% improvement in nitride etch rate by steam addition. The silicon oxide removal rate was 1.73 Å/minute.

All patents, patent applications, and publications cited herein are incorporated by reference as if individually incorporated. Unless otherwise indicated, all parts and percentages are by weight and all molecular weights are weight average molecular weights. The foregoing detailed description has been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of selectively removing silicon nitride from a substrate relative to a silicon oxide, comprising:
   a) providing a substrate having silicon nitride and a silicon oxide on a surface thereof; and
   b) dispensing a flowing, mixed acid liquid stream comprising sulfuric acid and phosphoric acid and a stream comprising water vapor, and
   c) using the flowing, mixed acid liquid stream to selectively etch the silicon nitride relative to the silicon oxide in the presence of the water vapor.

2. The method of claim 1, wherein, prior to step (b), treating the substrate with a pre-treatment liquid comprising HF.

3. The method of claim 1, wherein the water vapor comprises superheated steam.

4. The method of claim 1, wherein the mixed acid liquid stream is dispensed at a temperature greater than about 180° C.

5. The method of claim 1, wherein the mixed acid liquid stream is dispensed at a temperature at or greater than about 200° C.

6. The method of claim 1, wherein the mixed acid liquid stream is dispensed at a temperature of from about 190° C. to 240° C.

7. The method of claim 1, wherein the mixed acid liquid stream is dispensed at a temperature of from about 150° C. to 180° C.

8. The method of claim 1, wherein the water content of the mixed acid liquid stream after intersecting with the water vapor is from about 10% to about 20% by weight.

9. The method of claim 1, wherein the water content of the mixed acid liquid stream after intersecting with the water vapor is from about 11% to about 15% by weight.

10. The method of claim 1, wherein the mixed acid liquid stream is prepared by mixing a phosphoric acid solution that is at least about 80% by weight phosphoric acid with a sulfuric acid solution that is at least about 90% by weight sulfuric acid in a volume ratio of phosphoric acid to sulfuric acid that is from 3:1 to 1:6.

11. The method of claim 10, wherein the liquid sulfuric acid solution has a water/sulfuric acid molar ratio of no greater than about 5:1.

12. The method of claim 10, wherein the phosphoric acid solution is 85% (by weight) phosphoric acid and the sulfuric acid solution is 98% (by weight) sulfuric acid.

13. The method of claim 10, wherein the volume ratio of phosphoric acid to sulfuric acid is from 1:2 to 1:4.

14. The method of claim 1, wherein the water vapor is provided at a temperature of from about 80° C. to about 110° C.

15. The method of claim 1, wherein the water vapor is provided at a temperature of about 100° C.

16. The method of claim 1, wherein the substrate is rotating during the dispensing of the mixed acid liquid stream.

17. The method of claim 1, wherein the mixed acid liquid stream after intersecting the water vapor impinges the substrate in the form of a continuous stream.

18. The method of claim 1, wherein the mixed acid liquid stream after intersecting the water vapor impinges the substrate in the form of liquid aerosol droplets.

19. The method of claim 1, wherein the phosphoric acid and sulfuric acid are mixed in a vessel for storage prior to dispensing from a nozzle as a mixed acid liquid stream.

20. The method of claim 19, wherein the phosphoric acid and sulfuric acid are mixed in-line at a location upstream from the nozzle to form a mixed acid liquid stream.

21. The method of claim 1, wherein the phosphoric acid and sulfuric acid are mixed in a nozzle assembly prior to being ejected from the nozzle as a mixed acid liquid stream.

22. The method of claim 1, wherein the phosphoric acid and sulfuric acid are dispensed as separate liquid solutions in the form of streams from separate orifices of a nozzle assembly, wherein the dispensed separate streams impinge and form the mixed acid liquid stream externally of the nozzle and prior to contact with the substrate surface.

23. The method of claim 1, wherein the phosphoric acid and sulfuric acid are sprayed onto the surface of the substrate.

24. The method of claim 1, wherein the phosphoric acid and sulfuric acid are flowed onto the surface of the substrate.

25. The method of claim 1, wherein the water vapor and the dispensed, flowing, mixed acid liquid stream are dispensed and intersect prior to the water vapor and said stream impacting the substrate surface.

26. A method of selectively removing silicon nitride from a substrate comprising:
   a) providing a substrate having silicon nitride and a silicon oxide on a surface thereof;
   b) dispensing water vapor, phosphoric acid and sulfuric acid as separate streams;
   c) impinging the separate streams of water vapor, phosphoric acid and sulfuric acid to form a mixed acid liquid stream prior to contact with the substrate surface; and
   d) causing the mixed acid liquid stream to contact the substrate surface in the presence of the water vapor.

* * * * *